United States Patent

Yoda et al.

[19]

[11] Patent Number: 5,985,124
[45] Date of Patent: Nov. 16, 1999

[54] NICKEL OR NICKEL ALLOY ELECTROPLATING BATH AND PLATING PROCESS USING THE SAME

[75] Inventors: Toshihisa Yoda; Toru Negishi, both of Nagano; Toru Murakami, Hirakata; Tomomi Yaji, Hirakata; Taichi Nakamura, Hirakata; Tsutomu Sekiya, Tokyo, all of Japan

[73] Assignees: Shinko Electric Industries Co., Ltd., Nagano-ken; C. Uyemura & Co., Ltd., Osaka, both of Japan

[21] Appl. No.: 08/955,110

[22] Filed: Oct. 21, 1997

[30] Foreign Application Priority Data

Jan. 29, 1997 [JP] Japan ..................................... 9-029603

[51] Int. Cl.$^6$ ............................... C25D 3/12; C25D 5/02
[52] U.S. Cl. ..................... 205/118; 205/125; 205/135; 205/219; 205/255; 205/271
[58] Field of Search ..................... 205/118, 122, 205/123, 125, 135, 271, 219, 255

[56] References Cited

U.S. PATENT DOCUMENTS

| | | | |
|---|---|---|---|
| 4,190,474 | 2/1980 | Berdan et al. | 156/151 |
| 4,224,115 | 9/1980 | Nara et al. | 205/123 |
| 4,290,858 | 9/1981 | Engelhaupt | 205/50 |
| 4,518,467 | 5/1985 | Mason et al. | 205/111 |
| 4,891,480 | 1/1990 | Holden, Jr. et al. | 200/262 |
| 4,892,628 | 1/1990 | Guilinger | 205/243 |

FOREIGN PATENT DOCUMENTS

| | | |
|---|---|---|
| 0 147 463 | 7/1985 | European Pat. Off. . |
| 0 427 616 | 5/1991 | European Pat. Off. . |
| 0 502 475 | 9/1992 | European Pat. Off. . |
| 55-145194 | 11/1980 | Japan . |
| 2-22158 | 5/1990 | Japan . |
| 2-22160 | 5/1990 | Japan . |
| 2-44911 | 5/1990 | Japan . |
| 3-19308 | 3/1991 | Japan . |
| 3-19309 | 3/1991 | Japan . |
| 2 145 739 | 4/1985 | United Kingdom . |
| 2 157 709 | 10/1985 | United Kingdom . |
| 2 188 334 | 9/1987 | United Kingdom . |
| 2 233 348 | 1/1991 | United Kingdom . |

*Primary Examiner*—Kathryn Gorgos
*Assistant Examiner*—William T. Leader
*Attorney, Agent, or Firm*—Sughrue, Mion, Zinn, Macpeak & Seas, PLLC

[57] ABSTRACT

Disclosed is a nickel electroplating bath or a nickel alloy electroplating bath used for electroplating a conductor partially masked with an organic high-molecular resist layer, wherein the nickel electroplating bath contains a water-soluble nickel salt, and the nickel alloy electroplating bath contains both a water-soluble nickel salt and a water-soluble salt of a metal capable of being alloyed with nickel. The above electroplating bath is incorporated with an electrical conductive salt containing at least one cation selected from the group consisting of an ammonium ion, magnesium ion, calcium ion, aluminum ion, and barium ion. Further, the electrical conductive salt substantially does not contain a sodium ion and a potassium ion as cations. Such an electroplating bath is capable of electroplating a conductor partially masked with an organic high-molecular resist layer without floating of the resist layer.

5 Claims, 1 Drawing Sheet

NICKEL OR NICKEL ALLOY ELECTROPLATING BATH AND PLATING PROCESS USING THE SAME

BACKGROUND OF THE INVENTION

The present invention relates to a nickel or nickel alloy electroplating bath used for electroplating a conductor partially masked with an organic high-molecular resist layer, for example, a printed circuit board partially masked with a solder resist layer, and to an electroplating process using the bath. In particular, the present invention concerns a nickel or nickel alloy electroplating bath capable of electroplating the above conductor without floating (peeling) of the above resist layer during electroplating.

Nickel or nickel alloy electroplating has been used for printed circuit boards. Specifically, an organic high-molecular resist film (which is often called a solder resist film in the field of printed circuit boards) is partially formed on a printed circuit board, and a portion of the board excluding the area masked with the resist film is subjected to nickel or nickel alloy electroplating.

The above electroplating has been performed using a Watts type nickel electroplating bath mainly containing nickel sulfate and nickel chloride. Such a Watts type nickel electroplating bath, however, has been poor in macrothrowing power, and therefore, it has been expected to develop a new electroplating bath enhanced in macrothrowing power.

The nickel or nickel alloy plating baths enhanced in macrothrowing power have been known, for example, from Japanese Patent Publication Nos. Hei 2-22158, Hei 2-22160, Hei 2-44911, Hei 3-19308, and Hei 3-19309. In each of these plating baths, the concentration of a plating metal such as nickel is made relatively low, and an electrical conductive salt such as a halide, sulfate or sulfamate of an alkali metal, alkali earth metal, or aluminum is incorporated at a high concentration. In particular, a sodium salt or potassium salt has been practically used as the above electrical conductive salt.

The above-described nickel or nickel alloy plating bath enhanced in macrothrowing power, however, has problems. Specifically, in the case where a printed circuit board masked at a specific region thereof with the above resist layer is subjected to electroplating using the nickel or nickel alloy plating bath containing a sodium salt or a potassium salt in a large amount, there possibly occurs a floating (or peeling) phenomenon of the resist layer, although the macrothrowing power is undoubtedly enhanced. The floating of the resist layer leads to problems in that a copper underlayer of the printed circuit board is exposed and the copper layer thus exposed is corroded, and that the floating resist layer can no longer keep the solder resisting function resulting in occurrence of a solder bridging phenomenon upon soldering. These problems leads to critical defects of the printed circuit board. The floating of the resist layer has another problem. Specifically, although the resist layer is formed at the area where plating should not be performed, there is a possibility that a plating film is formed at a portion where the resist layer is floated (peeled).

It is to be noted that the above-described Watts type plating bath does not exhibit the floating phenomenon of the resist layer; however, as described above, it is poor in macrothrowing power.

In view of the foregoing, it has been required to develop a nickel or nickel alloy electroplating bath capable of giving a high macrothrowing power without floating of a resist layer.

SUMMARY OF THE INVENTION

An object of the present invention is to provide a nickel or nickel alloy electroplating bath capable of electroplating a conductor partially masked with an organic high-molecular resist layer at a high macrothrowing power without floating of the resist layer, and to provide an electroplating process using the bath.

The present inventors have experimentally studied to achieve the above object, and found that an electrical conductive salt used for a nickel or nickel alloy electroplating bath exerts a large effect on floating of a resist layer. Specifically, it has been found that the use of an electrical conductive salt having a sodium ion or a potassium ion as a cation causes the floating of the resist layer; however, the use of an electrical conductive salt containing an ammonium ion, magnesium ion, aluminum ion, calcium ion, or barium ion as a cation does not cause the floating of the resist layer. As a result, it has been found that a nickel or nickel alloy electroplating bath capable of giving a high macrothrowing power without floating of the resist layer can be achieved by addition of a high concentration of an electrical conductive salt containing $NH_4^+$, $Mg^{2+}$, $Al^{3+}$, $Ca^{2+}$, and/or $Ba^{2+}$. The present invention has been thus accomplished on the basis of the above knowledge.

Accordingly, the present invention provides:

(1) A nickel electroplating bath or a nickel alloy electroplating bath used for electroplating a conductor partially masked with an organic high-molecular resist layer, wherein the nickel electroplating bath contains a water-soluble nickel salt, and the nickel alloy electroplating bath contains both a water-soluble nickel salt and a water-soluble salt of a metal capable of being alloyed with nickel, characterized in that the nickel or nickel alloy electroplating bath is incorporated with an electrical conductive salt containing at least one cation selected from the group consisting of an ammonium ion, magnesium ion, calcium ion, aluminum ion, and barium ion, the electrical conductive salt substantially not containing a sodium ion and a potassium ion as cations;

(2) a nickel or nickel alloy electroplating bath according to the term (1), wherein the content of the water-soluble nickel salt for the nickel electroplating bath or of the water-soluble nickel salt and the water-soluble salt of a metal capable of being alloyed with nickel for the nickel alloy electroplating bath is within a range of 5 g/l to 40 g/l on the basis of nickel ion conversion;

(3) a nickel or nickel alloy electroplating bath according to the term 1 or 2, wherein the macrothrowing power of the electroplating bath, which is measured using a Haring cell in a condition that a distance ratio between two cathode plates and an anode plate is taken as 5, is 10% or more; and (4) a nickel or nickel alloy electroplating process, comprising the steps of: dipping a conductor partially masked with an organic high-molecular resist layer in the electroplating bath described in any one of terms (1) to (3); and applying a current to the electroplating bath using the conductor as a cathode; whereby a portion of the conductor exposed from the area masked with the resist layer is formed with a nickel or nickel alloy plating film.

A mechanism why the electroplating bath of the present invention prevents the floating of a resist layer, is not clear. However, for the related art electroplating bath including an electrical conductive salt containing $Na^+$ or $K^+$, it may be considered that $Na^+$ or $K^+$ permeates in the resist layer on the basis of a mechanism such as electrosmosis, and raises the coated resist layer, to thereby cause the floating of the resist layer. In this case, it may be also considered that a metal oxide between a base material and the resist layer is reduced due to generation of hydrogen or the generated hydrogen permeates under the resist layer and gasified, to raise the resist layer, thereby causing the floating of the resist layer; however, there is not observed any relationship between the generated amount of hydrogen upon nickel electroplating and the floating of the resist layer. Besides, each hydrated molecule of a cation ($NH_4^+$, $Mg^{2+}$, $Al^{3+}$, $Ca^{2+}$, $Ba^{2+}$), which does not cause the flowing of the resist layer, has a large size, and thereby it is hard to permeate in the resist layer, with a result that it becomes difficult to cause the floating of the resist layer. Alternatively, for an electrical conductive salt containing $Na^+$ or $K^+$, when hydrogen is generated, NaOH or KOH is produced at the plating interface and it makes stronger the alkalinity of the plating interface; however, for an electrical conductive salt containing a cation not causing the floating of the resist layer, the alkalinity of the plating interface is not so stronger as compared with the electrical conductive salt containing $Na^+$ or $K^+$. After all, the accurate mechanism why the electroplating bath of the present invention prevents the floating of the resist layer is not evident.

DETAILED DESCRIPTION OF THE PREFERRED EMBODIMENTS

Figure 1:
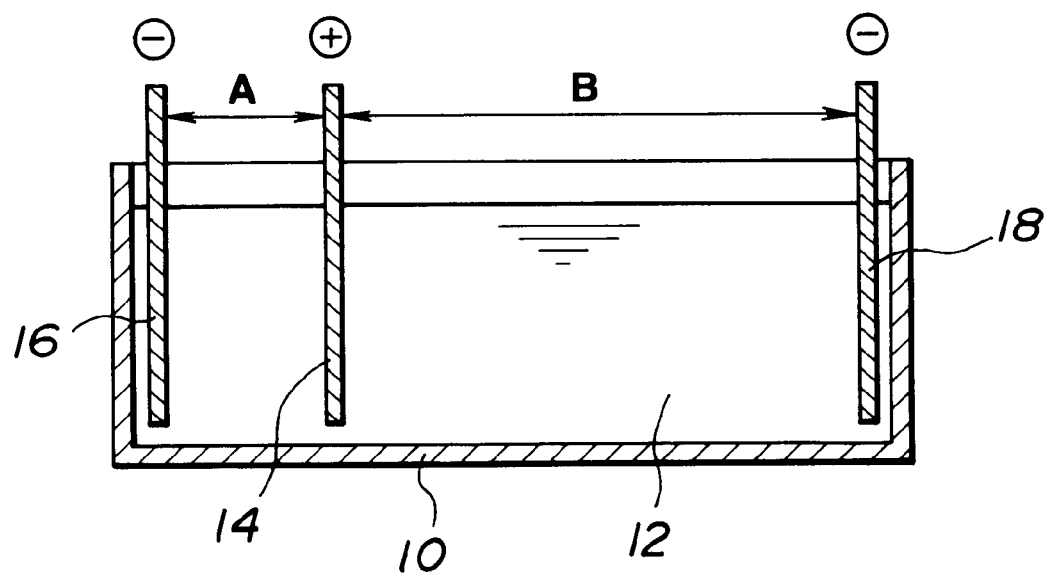
FIG. 1 is a sectional view of a Haring cell for measuring macrothrowing power.

A nickel or nickel alloy electroplating bath of the present invention mainly contains a water-soluble salt of a plating metal and a water-soluble electrical conductive salt.

In the case of a nickel electroplating bath, as the water-soluble salt of a plating metal, there is used a water-soluble nickel salt such as nickel sulfate, nickel chloride, nickel bromide, nickel sulfamate, or nickel methanesulfonate. In the case of a nickel alloy electroplating bath, as the water-soluble salts of plating metals, there is used, in addition to the above water-soluble nickel salt, a water-soluble salt of a metal capable of being alloyed with nickel such as cobalt or iron, for example, a sulfate, chloride, bromide, sulfamate, methanesulfonate of cobalt, iron or the like.

The content of the above water-soluble salt(s) of the plating metal(s) is preferably within a range of 5 to 40 g/l, more preferably within a range of 7 to 40 g/l on the basis of nickel ion conversion. When it is less than 5 g/l, the cathode current density required for electroplating is made small to such an extent as not to be practically used; while when it is more than 40 g/l, the macrothrowing power of the electroplating bath is reduced.

The water-soluble electrical conductive salt contains at least one cation selected from the group consisting of an ammonium ion, magnesium ion, aluminum ion, calcium ion, and barium ion. It is to be noted that the water-soluble electrical conductive salt substantially does not contain a sodium ion and potassium ion as a cation. Further, the water-soluble electrical conductive salt contains at least one anion selected from the group consisting of anions of sulfuric acid, hydrochloric acid, hydrobromic acid, sulfamic acid, and methanesulfamic acid. As the water-soluble electric conductive salt(s), there can be used at least one selected from the group consisting of ammonium salts, magnesium salts, calcium salts, aluminum salts, and barium salts of the above acids.

The content of the above electrical conductive salt is preferably within a range of 50 to 800 g/l, more preferably within a range of 150 to 500 g/l. When it is less than 50 g/l, the electric resistance of the plating bath is not reduced so much and thereby the macrothrowing power thereof cannot be sufficiently ensured; while it is more than 800 g/l, the additional effect is not significantly increased and thereby the practical usability is reduced.

The plating bath of the present invention can be incorporated with a buffer. Specific examples of the buffers may contain boric acid and water-soluble organic carboxylic acids such as citric acid, tartaric acid, succinic acid, and acetic acid, and salts thereof. As these salts, there may be preferably used an ammonium salt, magnesium salt, aluminum salt, calcium salt, and barium salt. The concentration of the buffer is preferably within a range of 20 to 100 g/l.

The plating bath of the present invention is also added with a known primary or secondary nickel plating brightener such as saccharin, butynediol or a derivative thereof. In this case, the amount of the primary brightener is preferably within a range of 0.1 to 5 g/l and the amount of the secondary brightener is preferably within a range of 0.01 to 3 g/l. Further, there may be added a phosphorous acid, phosphinic acid, or a salt thereof; a hydrazine compound, dimethylamine borane, or trimethylamine borane in an amount of 0.01 to 10 g/l in the form of co-deposition.

The plating bath of the present invention substantially does not contain a sodium ion and a potassium ion. The wording "substantially does not contain a sodium ion and a potassium ion" means that the content of the sodium ion and potassium ion is 5 g/l or less, particularly, 3 g/l or less. For example, saccharin may be added as a sodium salt in a very small amount, or sodium carboxylate or potassium carboxylate may be added as a buffer in an amount less than the above limited value.

The pH of the plating bath of the present invention is preferably within a range of 3.5 to 5.4.

The macrothrowing power of the plating bath of the present invention, which is measured using a Haring cell in a condition that a distance ratio between two cathode plates and an anode plate is taken as 5, is preferably within a range of 10% or more, more preferably within a range of 15% or more. The method of measuring the macrothrowing power using the Haring cell is as shown in FIG. 1 and in accordance with that described in Japanese Patent Publication No. Hei 2-22158. In FIG. 1, a Haring cell 10 has a length of 240 mm, a width of 63 mm and a depth of 100 mm. 1500 ml of a plating solution 12 is contained therein. Numeral 14 is an anode and numerals 16 and 18 are cathodes to be plated. The anode 14 is provided so that the ratio of the distance A between the anode 14 and the first cathode 16 and the distance B between the anode 14 and the second cathode 18 is 5 (=B/A) in the present invention. Electroplating is conducted in a predetermined time to deposit a plating film to the cathodes 16 and 18. The weight of the plating film deposited to the cathodes 16 and 18 is measured. The macrothrowing power is calculated from the following equation;

$$T(\%) = \frac{P - M}{P + M - 2} \times 100$$

wherein
T: macrothrowing power
P: distance ratio B/A (=5)
M: weight ratio $M_1/M_2$ in which $M_1$ is a weight of the plating film deposited to the first cathode 16 and $M_2$ is a weight of the plating film deposited to the second cathode 18.

The plating bath enhanced in macrothrowing power is advantageously used for electroplating of, for example, a printed circuit board or the like. That is, as compared with a plating bath low in macrothrowing power, a variation in thickness of a nickel plating film formed at the same area is small in the same plating condition. More specifically, the minimum plating thickness is thicker than that of the case using the plating bath low in macrothrowing power so that corrosion resistance and heat resistance are good irrespective of using a copper underlayer, and also the maximum plating thickness is thinner than that of the case of using the plating bath low in macrothrowing power so that the number of failures in wire bonding is reduced when gold plating is applied on the above plating film.

The plating bath of the present invention is used for plating a substance to be plated (conductor) partially masked with an organic high-molecular resist layer. In this case, the kind of the substance is not particularly limited, but a printed circuit board is preferably used as the substance. The process of forming an organic high-molecular resist layer is not particularly limited. For example, there may be used a process of coating a resist material (called a solder resist) of a solvent type, thermosetting type or development (alkali development) type and forming a resist layer by a known manner; or a process of applying a plating masking material such as a masking tape.

The plating condition for electroplating the above substance using the plating bath of the present invention may be suitably selected. For example, the plating temperature is preferably within a range of 45 to 65° C., and the cathode current density is preferably within a range of 0.1 to 4 $A/dm^2$. The agitation is preferably performed by cathode rocking at a velocity of 0.2 to 7 m/min. Liquid agitation such as slow air agitation or propeller agitation may be used; however, strong air agitation or strong liquid agitation is not desirable. In addition, there can be used as an anode, a nickel plate or the like which is the same as that used for a known nickel or nickel alloy plating.

A known pre-treatment can be applied to a substance to be plated by using the nickel or nickel alloy electroplating bath of the present invention. From the viewpoint of the above floating of a resist layer, such a pre-treatment as to generate hydrogen gas by electrolysis should be avoided. For example, dipping degreasing not generating hydrogen gas is superior to cathode electrolytic degreasing. In the case of using an electrolytic degreaser, the floating of the resist layer can be prevented not by use of $Na^+$ and $K^+$ but by use of $NH_4^+$, $Mg^{2+}$, $Al^{3+}$, $Ca^{2+}$ and/or $Ba^{2+}$ as cation(s).

After the above nickel or nickel alloy electroplating, gold strike plating, gold plating, palladium or palladium alloy plating, silver plating, or platinum plating may be performed.

The electroplating bath of the present invention, as described above, is capable of electroplating a substance to be plated (conductor) partially masked with an organic high-molecular resist layer without floating of the resist layer.

EXAMPLE

The present invention will be more clearly understood with reference to the following inventive examples and comparative examples.

Example 1

In this example, there was used a nickel electroplating bath having the following composition:

| | |
|---|---|
| $MgSO_4 \cdot 7H_2O$ | 400 g/l |
| $NiCl_2 \cdot 6H_2O$ | 50 g/l |
| boric acid: | 4.5 g/l |
| pH: | 4.6 |

A printed circuit board was coated at a specific area thereof with a solder resist film of a thermosetting type or development (alkali development) type to a thickness of 5 to 100 μm, and then it was subjected to nickel electroplating using the nickel electroplating bath having the above composition. The electroplating condition was as follows:

plating temperature: 55° C.

agitation: cathode rocking at velocity of 1 m/min perpendicularly to plating surface

| | |
|---|---|
| plating time: | 35 min |
| cathode current density: | 1 $A/dm^2$ |
| anode: | electrolytic nickel |
| thickness of plating film: | 6–9 μm |

As a result, it was confirmed that the macrothrowing power was good and the floating of the solder resist film was not recognized al all.

Example 2

The procedure in Example 1 was repeated except for the use of a nickel-cobalt alloy electroplating bath having the following composition:

| | |
|---|---|
| ammonium sulfamate: | 200 g/l |
| $NiCl_2 \cdot 6H_2O$ | 70 g/l |
| $CoSO_4 \cdot 7H_2O$ | 1 g/l |
| triammonium citrate: | 50 g/l |
| pH: | 4.6 |

As a result, it was confirmed that the thickness of the plating film was within a range of 6 to 10 μm and the macrothrowing power was good, and the floating of the solder resist film was not recognized at all.

Example 3

The procedure in Example 1 was repeated except that $MgCl_2 \cdot 6H_2O$ was further added to the electroplating bath used in Example 1 in an amount of 70 g/l. As a result, it was confirmed that the thickness of the plating film was within a range of 6.7 to 9 μm and the macrothrowing power was further enhanced, and the floating of the solder resist film was not recognized at all.

Comparative Example 1

The procedure in Example 1 was repeated except that magnesium sulfate (400 g/l) in Example 1 was replaced with sodium sulfate in an amount of 200 g/l. As a result, it was confirmed that the thickness of the plating film was within a range of 6 to 9 μm just as in Example 1, but the floating of the solder resist film was recognized.

Comparative Example 2

The procedure in Example 1 was repeated except for the use of a Watts type nickel electroplating bath having the following composition:

| | |
|---|---|
| NiSO$_4$.6H$_2$O | 280 g/l |
| NiCl$_2$.6H$_2$O | 50 g/l |
| boric acid: | 46 g/l |
| pH: | 4.6 |

As a result, it was confirmed that the floating of the solder resist layer was not recognized, but the thickness of the plating film was within a range of 2 to 20 μm and the macrothrowing power was poor.

Next, the macrothrowing power of the electroplating bath in each of Examples 1, 2, 3 and Comparative Examples 1, 2 was measured by a manner of performing electroplating using the Haring cell (distance ratio of two cathode plates and an anode plate: 5) at a current of 2 A while performing air agitation for 30 min. The results are shown in Table 1.

TABLE 1

| | macrothrowing power (%) |
|---|---|
| Example 1 | 25 |
| Example 2 | 23 |
| Example 3 | 35 |
| Comparative Example 1 | 25 |
| Comparative Example 2 | 6 |

From the results shown in Table 1, it becomes apparent that the macrothrowing power in Comparative Example 2 using the Watts type nickel electroplating bath is significantly poor as compared with those in Examples 1, 2, 3.

While the preferred embodiments of the present invention have been described using the specific terms, such description is for illustrative purposes only, and it is to be understood that changes and variations may be made without departing the spirit or scope of the following claims.

What is claimed is:

1. A method of nickel or nickel alloy electroplating a conductor partially masked with an organic polymeric resist layer comprising the steps of:

dipping the conductor partially masked with an organic polymeric resist layer in an electroplating bath comprising a water-soluble nickel salt or both a water-soluble nickel salt and a water-soluble cobalt salt in a concentration of 5 to 40 g/l on the basis of nickel ion equivalent and an electrically conductive salt containing at least one cation selected from the group consisting of an ammonium ion, magnesium ion, calcium ion, aluminum ion, and barium ion in a concentration of 150 to 500 g/l, said electrical conductive salt substantially not containing a sodium ion and a potassium ion as cations, and said electroplating bath having a pH of 3.5 to 5.4; and applying a current to said electroplating bath using said conductor as a cathode;

whereby a portion of said conductor other than the area masked with said resist layer is formed with a nickel or nickel-cobalt alloy plating film without floating or peeling of said resist layer.

2. A method of nickel or nickel alloy electroplating a conductor partially masked with an organic polymeric resist layer according to claim 1, wherein said electroplating bath has a macrothrowing power, which is measured using a Haring cell in a condition that a distance ratio between two cathode plates and an anode plate is taken as 5, of 10% or more.

3. A method of nickel or nickel alloy electroplating a conductor partially masked with an organic polymeric resist layer according to claim 1, wherein said conductor is subject to a pre-treatment before being electroplated.

4. A method of nickel or nickel alloy electroplating a conductor partially masked with an organic polymeric resist layer according to claim 3, wherein said pre-treatment does not generate hydrogen gas by electrolysis.

5. A method of nickel or nickel alloy electroplating a conductor partially masked with an organic polymeric resist layer according to claim 3, wherein said pre-treatment comprises using an electrolytic degreaser, wherein cations in the electronic degreaser are selected from group consisting of NH$^{4+}$, Mg$^{2+}$, Al$^{3+}$, Ca$^{2+}$, and Ba$^{2+}$.

* * * * *